United States Patent
Lee et al.

(10) Patent No.: US 12,402,393 B2
(45) Date of Patent: *Aug. 26, 2025

(54) FinFET EPI CHANNELS HAVING DIFFERENT HEIGHTS ON A STEPPED SUBSTRATE

(71) Applicant: Taiwan Semiconductor Manufacturing Co., Ltd., Hsinchu (TW)

(72) Inventors: Cheng-Han Lee, New Taipei (TW); Chih-Yu Ma, Hsinchu (TW); Shih-Chieh Chang, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/149,495

(22) Filed: Jan. 3, 2023

(65) Prior Publication Data
US 2023/0154802 A1    May 18, 2023

Related U.S. Application Data

(60) Continuation of application No. 16/696,327, filed on Nov. 26, 2019, now Pat. No. 11,545,399, which is a
(Continued)

(51) Int. Cl.
*H10D 84/03*  (2025.01)
*H01L 21/02*  (2006.01)
(Continued)

(52) U.S. Cl.
CPC ..... *H10D 84/038* (2025.01); *H01L 21/02381* (2013.01); *H01L 21/0243* (2013.01);
(Continued)

(58) Field of Classification Search
CPC ....... H01L 21/823821; H01L 21/02381; H01L 21/0243; H01L 21/02532; H01L 21/02642;
(Continued)

(56) References Cited

U.S. PATENT DOCUMENTS 7,667,271 B2    2/2010    Yu et al.
8,362,575 B2    1/2013    Kwok et al.
(Continued)

*Primary Examiner* — Shaun M Campbell
(74) *Attorney, Agent, or Firm* — Slater Matsil, LLP

(57) ABSTRACT

A structure includes a stepped crystalline substrate that includes an upper step, a lower step, and a step rise. A first fin includes a crystalline structure having a first lattice constant. The first fin is formed over the lower step. A second fin includes a crystalline structure having a second lattice constant, the second lattice constant being different than the first lattice constant. The second fin can be formed over the upper step apart from the first fin. A second crystalline structure can be formed over the first crystalline structure and the tops of the fins aligned. The first and second fins can be made of the same material, but with different heights and different channel strain values. The first fin can be used as an NMOS fin and the second fin can be used as a PMOS fin of a CMOS FinFET.

20 Claims, 9 Drawing Sheets

Related U.S. Application Data division of application No. 15/332,055, filed on Oct. 24, 2016, now Pat. No. 10,510,618.

(51) Int. Cl.
*H10D 30/62* (2025.01)
*H10D 30/69* (2025.01)
*H10D 84/01* (2025.01)
*H10D 84/85* (2025.01)

(52) U.S. Cl.
CPC .. *H01L 21/02532* (2013.01); *H01L 21/02639* (2013.01); *H01L 21/02642* (2013.01); *H10D 30/6211* (2025.01); *H10D 30/798* (2025.01); *H10D 84/0167* (2025.01); *H10D 84/0193* (2025.01); *H10D 84/853* (2025.01)

(58) Field of Classification Search
CPC ......... H01L 21/823807; H01L 27/0924; H01L 29/7849; H01L 29/7851
See application file for complete search history.

(56) References Cited

U.S. PATENT DOCUMENTS

| | | | |
|---|---|---|---|
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 11,545,399 B2 * | 1/2023 | Lee | H01L 21/02532 |
| 2011/0068407 A1 | 3/2011 | Yeh et al. | |
| 2013/0011983 A1 | 1/2013 | Tsai et al. | |
| 2013/0221443 A1 * | 8/2013 | Lin | H01L 21/3065 257/E27.06 |
| 2013/0234147 A1 * | 9/2013 | Wu | H01L 21/02636 257/190 |
| 2013/0307021 A1 | 11/2013 | Ching et al. | |
| 2014/0124860 A1 | 5/2014 | Cheng et al. | |
| 2014/0124863 A1 | 5/2014 | Cheng et al. | |
| 2014/0252412 A1 | 9/2014 | Tsai et al. | |
| 2014/0284723 A1 * | 9/2014 | Lee | H01L 29/0649 257/369 |
| 2017/0053835 A1 * | 2/2017 | Sung | H01L 29/66818 |

\* cited by examiner

FinFET EPI CHANNELS HAVING DIFFERENT HEIGHTS ON A STEPPED SUBSTRATE

CROSS-REFERENCE TO RELATED APPLICATION

This application is a continuation of U.S. patent application Ser. No. 16/696,327, filed on Nov. 26, 2019, which is a divisional of U.S. patent application Ser. No. 15/332,055 (now U.S. Pat. No. 10,510,618, issued Dec. 17, 2019), entitled "FinFET EPI Channels Having Different Heights on a Stepped Substrate," filed on Oct. 24, 2016, which applications are incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins. Although existing FinFET devices and methods of fabricating FinFET devices have been generally adequate for their intended purposes, they have not been entirely satisfactory in all respects. For example, a more flexible integration for forming fin and isolation structures is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
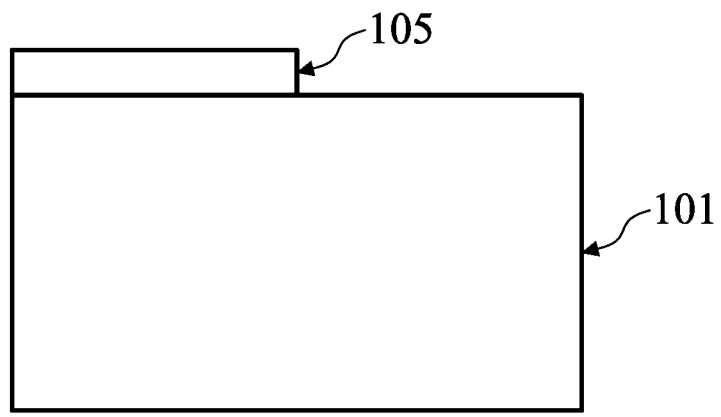
FIGS. 1-8 illustrate cross-sectional views of intermediate stages in the manufacturing of fins of a FinFET, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various example embodiments. The intermediate stages of forming the fins of a FinFET in accordance with some embodiments are illustrated. Variations of the embodiments are discussed. Throughout the various views and illustrative embodiments, like reference numbers are used to designate like elements.

FinFETs that have been epitaxially grown can be complex because different device types can require different fin materials. For example, a p-type fin can call for a growth of silicon germanium (SiGe), while an n-type fin can call for a growth of another semiconductor-based material or less of silicon germanium than the p-type fin. The differences may be due to the requirements of a punch through stop region at the base of the fin, where in a p-type fin subthreshold leakage current would tend to present a greater problem than in an n-type fin. Epitaxy of different materials can result in different growth rates. Or even if the fins were made of the same materials over a crystalline substrate, varying the height of the epitaxy can be difficult for different fin types or different fin applications.

Embodiments of the present disclosure allow for two or more fins of a FinFET device to be epitaxially grown on a substrate using the same materials in each fin, but producing a different lattice constant in one fin verses the other and different strain profiles in each fin. This allows one fin to be used as an n-type fin in an n-type semiconductor area of a semiconductor device and another fin to be used as a p-type fin in a p-type semiconductor area of a semiconductor device. A FinFET including n-type fins can be used to manufacture a p-channel metal oxide semiconductor (PMOS) using a p-type doped substrate. A FinFET including p-type fins can be used to manufacture an n-channel metal oxide semiconductor (NMOS) using an n-type doped substrate. The two types of fins (the NMOS and PMOS fins) can be used together to manufacture a complimentary metal oxide semiconductor (CMOS) FinFET device. Further, although the two fins have different effective heights, their top most surfaces are aligned, thereby allowing for formation of other components of a FinFET as if the fins were the same height.

FIG. 1 illustrates a FinFET semiconductor structure at an early stage of production. Semiconductor substrate 101 can be part of a semiconductor wafer or a semiconductor device. In accordance with some embodiments of the present disclosure, semiconductor substrate 101 includes crystalline silicon. Other materials that can be used in the substrate 101 include carbon, germanium, gallium, boron, arsenic, nitrogen, indium, and/or phosphorus, and the like. Semiconductor substrate 101 may also include other semiconductor materials such as III-V compound semiconductor materials. Semiconductor substrate 101 can be a bulk substrate or a Semiconductor-on-Insulator (SOI) substrate. Furthermore, the substrate 101 may include other features. For example, the substrate may include various doped regions depending on design requirements (e.g., p-type substrate or n-type substrate). For example, the doped regions may be doped with p-type dopants, such as boron or $BF_2$, n-type dopants, such as phosphorus or arsenic, and/or combinations thereof. The doped regions may be configured for an n-type FinFET, or alternatively configured for a p-type FinFET.

Element 105 of FIG. 1 illustrates the addition of a photoresist layer or silicon oxide resist layer 105 that is deposited over substrate 101 and then patterned, thereby forming openings in the resist layer 105. Generally, photolithography techniques utilize a photoresist material (such as photo resist 105) that is deposited, irradiated (exposed), and developed to remove a portion of the photoresist material. The remaining photoresist material protects the underlying material, such as the substrate 101 in this example, from subsequent processing steps, such as etching. In this example, the photoresist material is patterned to define an area of the substrate 101 that will be etched and, conversely, an area of the substrate 101 that will be protected from etchant.

Figure 2:
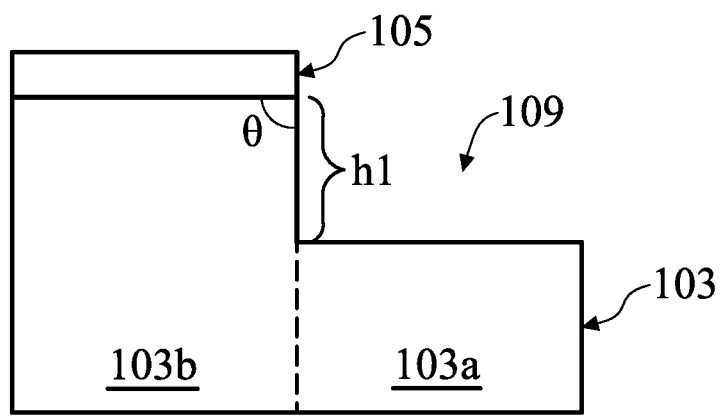

Referring to FIG. 2, the silicon substrate 101 is etched to form a stepped substrate 103. Stepped substrate 103 can have a lower step 103a and an upper step 103b. The lower step 103a has a height less than the height of the upper step 103b. The difference in the height of 103a and 103b is h1. The height h1 will vary by application. In some embodiments h1 is between about 15 nm and 100 nm, for example about 20 nm. In other embodiments the step height difference h1 can be up to and including about 1 µm. The step height h1 can be optimized based on different fin height requirements. The etchant used to etch opening 109 in substrate 101 to form stepped substrate 103 can be a dry etch, a wet etch, a plasma etch and so forth. In some embodiments, the silicon etch can be chlorine gas ($Cl_2$) or hydrogen bromide (HBr). Although an anisotropic etch is desirable, which can more closely result in the stepped substrate illustrated in FIG. 2, in some embodiments, the step can be angled toward or away from the upper step 103b. In other words the angle θ can be about 90 degrees for an anisotropic etch, as illustrated, or can be more or less than 90 degrees in some embodiments. For example, the angle θ can be in a range of about 75 degrees to about 130 degrees, depending on the etchant used and step height h1.

Following the etching of the substrate 101 to form the stepped substrate 103, photoresist mask layer 105 can be removed. Various techniques can be used to remove photoresist mask layer 105, such as by a Chemical Mechanical Polish (CMP) process, photoresist solvent, or etch.

Figure 3:
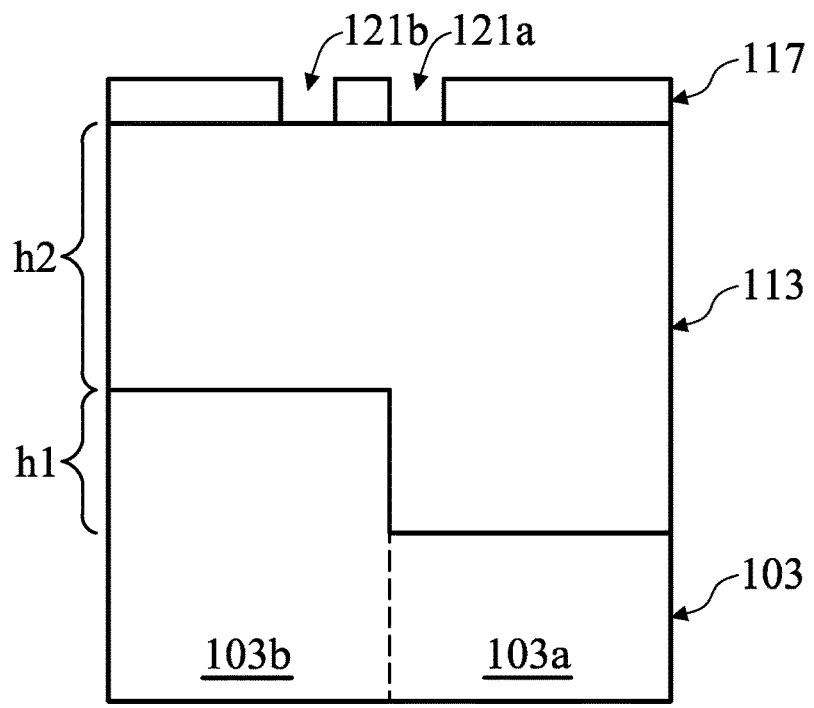

Turning to FIG. 3, a hard mask 113 can be disposed over the stepped substrate 103. The hard mask can be made of any suitable material that has a high selectivity to etchants, such as silicon oxide (SiO), silicon nitride (SiN), or silicon oxycarbide (SiOC). Other suitable materials for hard mask 113 can include silicon carbide (SiC), Tantalum Nitride (TaN), Titanium Nitride (TiN), a low-k dielectric material (such as SiO2, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers), or spin-on carbon (SOC). In some embodiments, after deposition or formation of hard mask 113, a top surface of the hard mask 113 can be planarized, for example, by a CMP process.

Hard mask 113 can be applied through a single step or multi-step process. Such process(es) can include deposition, such as Sub Atomic Chemical Vapor Deposition (SACVD), Flowable Chemical Vapor Deposition (FCVD), Chemical Vapor Deposition (CVD), Atomic Layer Deposition (ALD), and the like. In some embodiments, hard mask 115 can be applied as a liquid and then cured, heated, or annealed. For example, in embodiments where hard mask 113 is SOC, the SOC material may be dispensed as a liquid, and may be formed from raw materials that include elements such as C. H. O. N. F. Br, and S. The SOC material may be between about 50% and about 95% carbon.

In some embodiments, hard mask 113 can be deposited in a first step to fill the opening 109 at a thickness of about h1 and in a second step to a thickness of about h2. The thickness h2 can be equal to or slightly more than a desired minimum fin height, where the minimum fin height is measured from a top surface of the upper step 103b of stepped substrate 103 to a top surface of a completed fin.

A second resist layer 117 of FIG. 3 can be deposited over hard mask 113. Second resist layer 117 can be a photoresist layer that is deposited over hard mask 113 and then patterned, thereby forming openings 121a and 121b in the resist layer 117. The remaining photoresist material protects the underlying material, such as the hard mask 113, from subsequent processing steps, such as etching. The photoresist material is patterned to define openings 121a and 121b, which correspond to where fins will be formed over the stepped substrate 103.

Figure 4A:
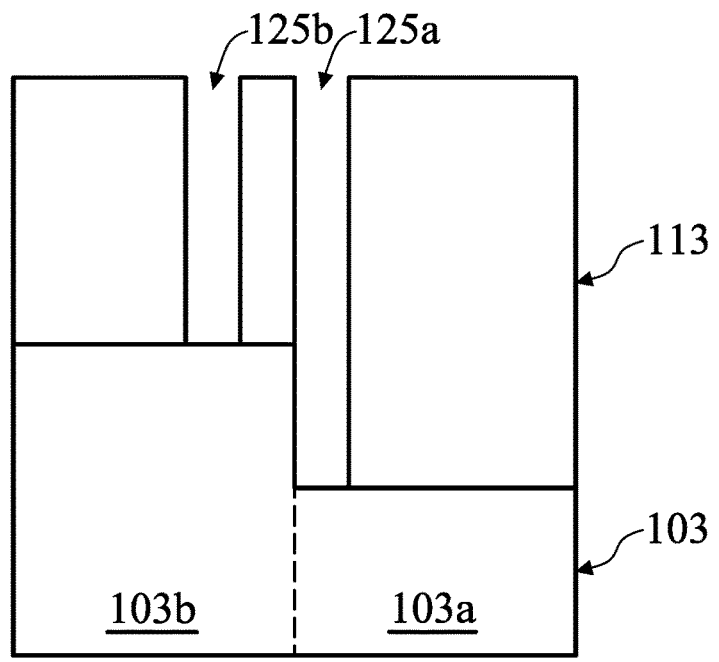
Figure 4B:
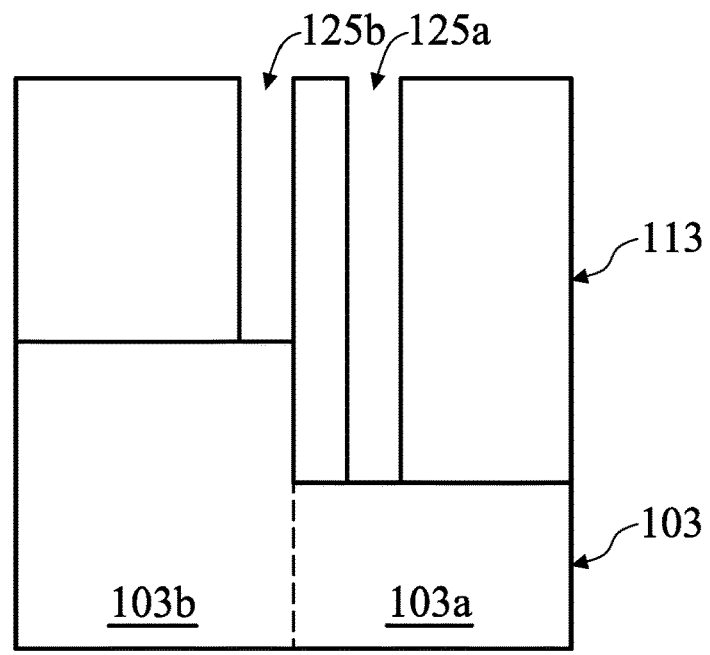
Figure 4C:
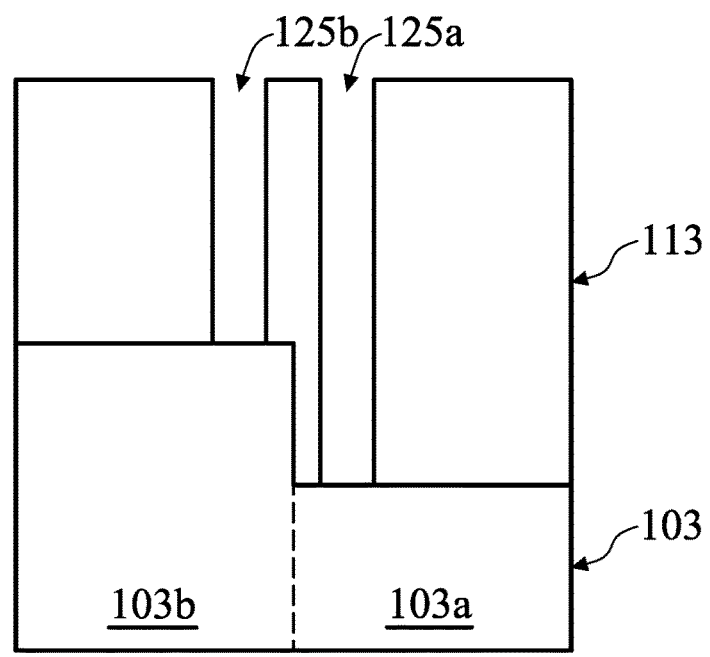

Referring to FIG. 4a, using resist layer 117, recesses 125a and 125b can be formed in hard mask 113. In some embodiments, such as illustrated in FIG. 4a, recess 125a can be vertically aligned with the rise of the step of stepped substrate 103, such that one side of recess 125a comprises the rise of the step. In other embodiments, such as illustrated in FIG. 4b, recess 125b can be vertically aligned with the rise of the step of stepped substrate 103, such that one side of recess 125b coincides with the top edge of the upper step 103b. In other embodiments, such as illustrated in FIG. 4c, recesses 125a and 125b can be situated on either side of a portion of hard mask 113 such that neither is coincident with the step rise of stepped substrate 103. In such embodiments, the portion of hard mask 113 that lies between recess 125a and 125b can overlap the step rise.

Figure 5:
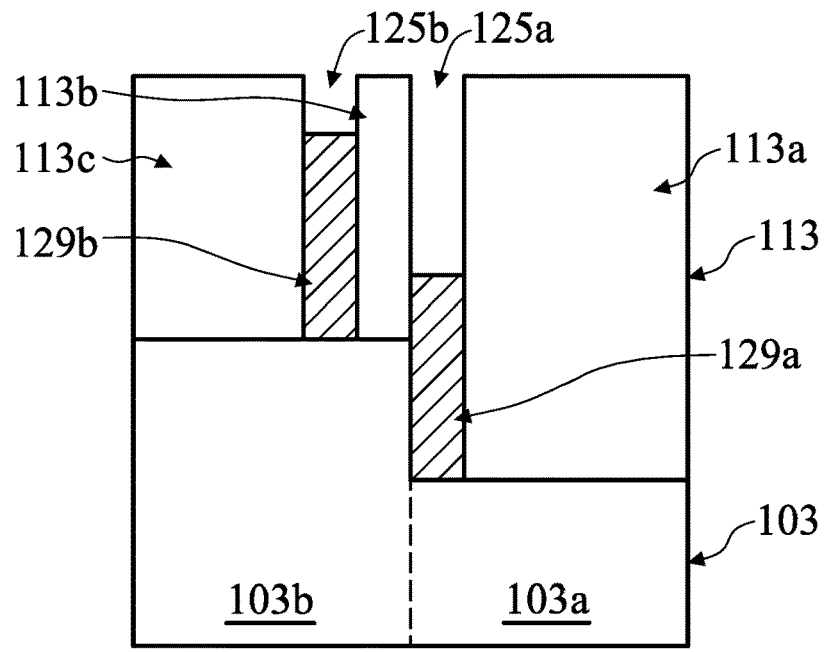

As illustrated in FIG. 5, a material 129a and 129b can be formed within the recess 125a and 125b. In some embodiments, the material can be formed by epitaxial growth from the bottom of the recess, i.e., at an uppermost surface of the stepped substrate portion 113a and an uppermost surface of the stepped substrate portion 113b. The material used in the formation of epitaxy 129a and 129b is the same in both recesses. Because the material formed in each recess is the same, the cost and complexity of growing the material 129a and 129b can be reduced. Also, because the material is the same, the growth rates of 129a and 129b will be similar, subject to normal variations. This results in the height of material 129a and 129b being approximately the same when measured from the stepped substrate to an uppermost surface of each of the respective materials 129a and 129b. As the material is epitaxially grown, the resulting material is crystalline. Because the stepped substrate 103 is comprised of crystalline silicon, it can help seed the epitaxy materials 129a and 129b.

The height and width of the epitaxy materials 129a and 129b can depend on the application and fin technology. For example, the epitaxy materials 129a and 129b can be grown to be about 25 nm to about 2 µm tall and about 5 nm to about 1 μm wide. A ratio of height to width can be in a range of about 2:1 to about 10:1. For example, in some embodiments the height of the epitaxy materials 129a and 129b can be about 30 nm and the width about 8 nm.

In some embodiments, the material in 129a and 129b is silicon germanium (SiGe). Other materials that can be used depending on application are pure germanium (Ge) or elements taken from groups III-V or combinations and compositions thereof, and so forth.

In embodiments consistent with the structure illustrated in FIG. 4a, the additional growth surface provided by the step rise of substrate 103 can provide a larger lattice constant due to strain relaxation in the material 129a grown in recess 125a than the material 129b grown in recess 125b.

Where the material 129a has a larger lattice constant than the material 129b, the fins can be used differently. For example, in one embodiment, the fin comprising material 129a can be used for an n-type transistor and the fin comprising material 129b can be used for a p-type transistor. The material 129a can be considered a virtual substrate and a strain supplier for the material deposited thereon.

In other embodiments, the fins can be used in other configurations according to a desired application.

Because the epitaxial growth of materials 129a and 129b is constrained by hard mask 113 on either side of recess 125a and 125b, as materials 129a and 129b epitaxially grow, outward lateral pressure (strain) can be exhibited against hard mask 113. This outward pressure can cause or exacerbate an increased density of the hard mask 113 proximate to the growth area. In some embodiments, for example in FIG. 5, the left side of hard mask portion 113a will be affected to form higher density portions of 113a proximate to the material 129a. Similarly, the right side of hard mask portion 113c will be affected to form higher density portions of 113c proximate to the material 129b. Where the hard mask material 113b is between both material 129a and 129b, the density can be even greater as pressure is exerted from both materials 129a and 129b on hard mask 113b.

Figure 6:
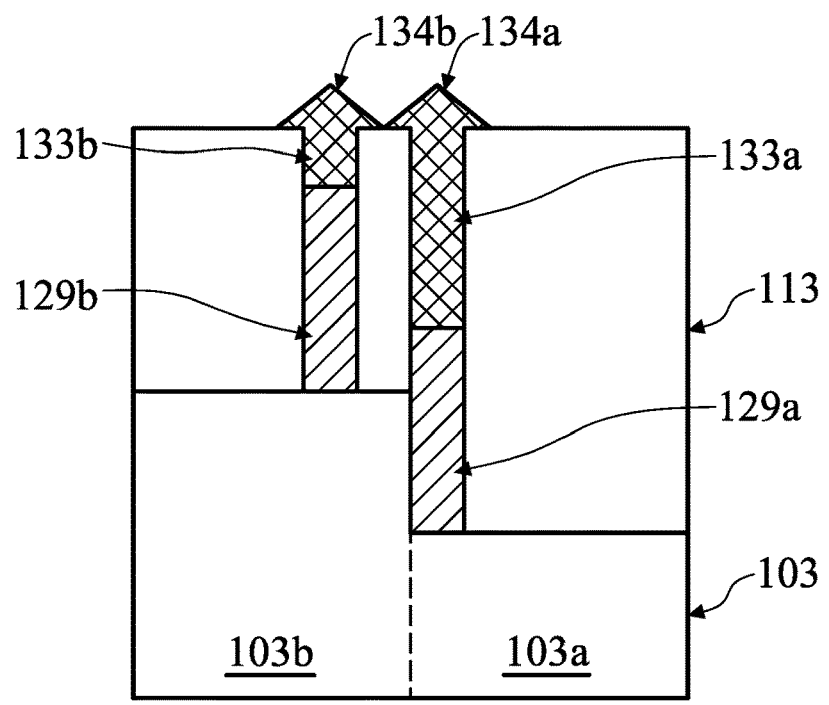

Referring to FIG. 6, next semiconductor-based epitaxy 133a and 133b can be epitaxially grown over materials 129a and 129b. Because the recess 125a and 125b of FIG. 5 have different depths, the semiconductor-based epitaxy is overgrown in the recesses to form faceted portions 134a and 134b. The semiconductor-based epitaxy can be referred to as a semiconductor epitaxy and can include materials such as silicon (Si), silicon geranium (SiGe), germanium (Ge), germanium alloys such as GeSn, and other group III-IV compounds. The epitaxy in 129a and 133a are made of different materials. Using different materials with different lattice constants will induce tensile/compressive stress in the channel region. The width of the semiconductor-based epitaxy 133a and 133b will follow the profile of recess 125a and 125b and the height of the semiconductor-based epitaxy 133a and 133b can be greater than the height of the depth of the recess 125a and 125b after the epitaxial growth of material 129a and 129b, such as illustrated in FIG. 5. In some embodiments, the semiconductor-based epitaxy 133a may not overgrow the recess 125a.

Figure 7:
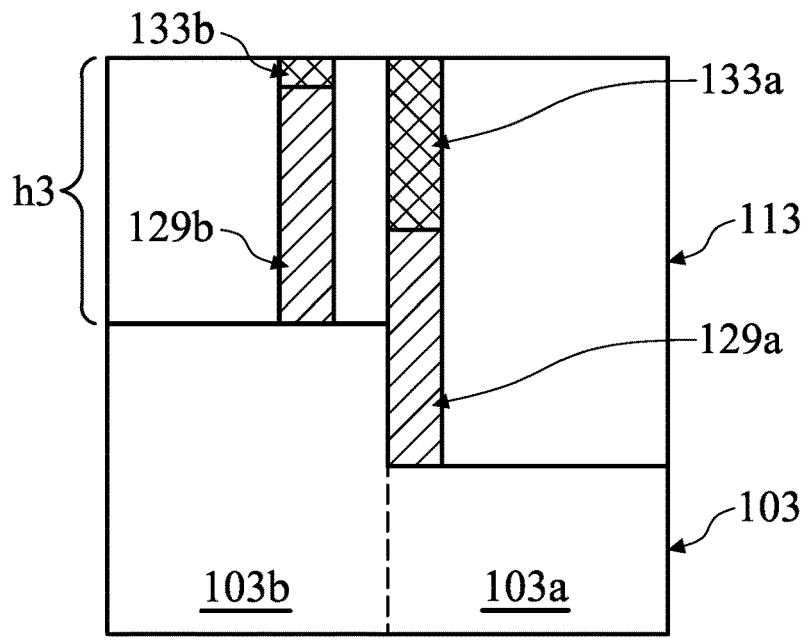

As illustrated in FIG. 7, the top surface of the hard mask layer 113 can be planarized to make a top surface of the semiconductor epitaxy 133a and 133b coplanar with each other and coplanar with hard mask layer 113. Planarization can be accomplished, for example by a CMP process. Planarization can remove none or some of hard mask layer 113. In some embodiments, after planarization, the height h3 can be less than the height h2 of FIG. 3. In other embodiments, after planarization, the height h3 can be substantially equal to the height h2 of FIG. 3.

The epitaxy material 129a and 129b, such as SiGe, applies compressive stress to the adjacent area of the recess 125a and 125b with positive strain values. The epitaxy material 129a and 129b also induces tensile stress to the upper area (the semiconductor-based epitaxy 133a and 133b) with negative strain values. The induced tensile stress can result in mobility in the upper area of the channel 141a. In the channel 141b the semiconductor-based epitaxy 133b is much smaller in volume/height than the semiconductor-based epitaxy 133a in the channel 141a, resulting in a strain differential between the strained semiconductor-based epitaxy 133a for an n-type fin (such as an NMOS fin) and the epitaxy material channel 129b (e.g., SiGe) for a p-type fin (such as a PMOS fin). The semiconductor-based epitaxy cap 133b remaining over the epitaxy material 129b can provide a layer for increased resiliency to high temperatures that can be subjected to the FinFET structure in subsequent steps, such as annealing.

Figure 8:
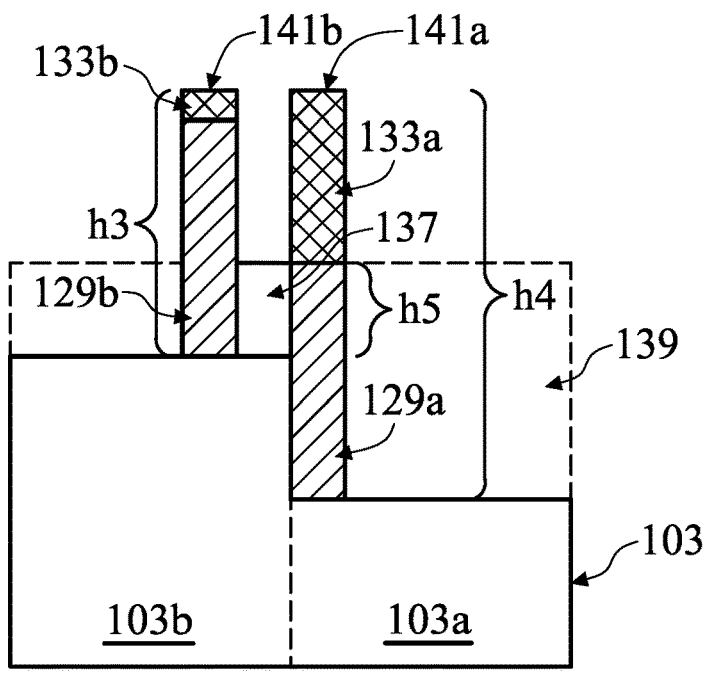

Following planarization of the structure, as illustrated in FIG. 8, the hard mask material 113 can be removed to reveal fins 141a and 141b. The hard mask material 113 can be removed using an etchant. The etchant can include a wet etchant or a dry etchant. In some embodiments, the silicon etch can be an oxygen ($O_2$) plasma, $N_2H_2$ plasma, or other suitable etchant. In some embodiments, the etchant can remove most of the hard mask material 113, however, some hard mask material 137 can remain behind. For example, in some embodiments, where the density of the hard mask material 113 was increased due to the epitaxy material 129a and 129b of FIG. 5, some high density hard mask material 137 can remain behind. In some embodiments, all of the hard mask material 113 can be removed.

In embodiments where high density hard mask 137 remains behind after etching hard mask 113, the high density hard mask can act as an isolation region 137 with similar properties to a shallow trench isolation (STI) region. In embodiments where all the hard mask material is removed, an isolation material 137 can be deposited or formed between fins 141a and 141b.

In some embodiments, additional isolation material 139 can be deposited (not shown), for example to the right side of fin 141a and to the left side of fin 141b as shown in dotted lines in FIG. 8.

Although isolation region 137 is shown as having a flat top surface which is coincidental to a transition between epitaxy material 129a and semiconductor epitaxy 133a, in some embodiments the isolation region 137 can have a curved top surface, for example a u-shaped top in cross-section view. In some embodiments, the isolation region 137 can have a height h5 with a top surface that is higher or lower than the transition between epitaxy material 129a and semiconductor epitaxy 133a. In some embodiments, where the top surface of the isolation region 137 is lower than the transition between epitaxy material 129a and semiconductor epitaxy 133a, additional isolation material can be added over isolation region 137.

The resulting structure of FIG. 8 includes a first fin (channel) 141a and a second fin (channel) 141b. The fins have top surfaces that are aligned at a same height h4 from the lower step substrate 103a top surface. The overall height of the first fin 141a is a height of h4. The overall height of the second fin 141b is a height of h3. Each fin comprises a same material 129a and 129b, however 129a and 129b can have different lattice constants. Each fin also comprises a semiconductor-based epitaxy 133a and 133b. An isolation region 137 remains between the two fins. In some embodiments, the fin 141a can form an NMOS strained silicon (Si) channel. The fin 141b can form a PMOS silicon germanium (SiGe) channel (or other epitaxy material channel, depending on design and application).

By differentiating fin heights in different device regions, the junction window is increased, which means that the fin heights of a FinFET in different device regions are no longer tied together. With the FinFET having different fin heights in different device regions, tuning the performance of devices in different device regions can be more easily accomplished. For example, in one embodiment fin 141a is an n-type fin in a device region coincident with 103a of the FinFET and fin 141b is a p-type fin in a device region coincident with 103b of the FinFET. The effective fin height h4 of n-type fin 141a is greater than the fin height h3 of p-type fin 141b. Accordingly, n-type fin 141a and p-type fin 141b may be used in a same logic area. For example, n-type fin 141a may be a pull-up transistor, and p-type fin 141b may be a pull-down transistor. The greater fin height of n-type fin 141a may compensate for the lower hole mobility compared to the higher electron mobility of p-type fin 141b. The performance of p-type fin 141b and the performance of n-type fin 141a may thus be balanced.

In another example, in accordance with some embodiments, fin 141a and fin 141b can be used to manufacture a complementary metal oxide semiconductor (CMOS) FinFET device. However, because each fin can comprise the same materials, the complexity of manufacturing the CMOS device can be reduced. The CMOS device manufactured from the structure in FIG. 8 can have a semiconductor n-region defined by the lower step 103a of the stepped substrate 103 and a semiconductor p-region defined by the upper step 103b of the stepped substrate 103. A boundary between the n-region and p-region can be defined by the step rise.

In some embodiments, a CMOS device can be made from the structure in FIG. 8 by adding a gate insulator and gate over the fins and source/drain regions. Because the tops of the fins 141a and 141b are aligned, the addition of other component parts of the FinFET can be accomplished more easily than if the tops were not aligned.

It should be noted that while FIG. 8 shows the FinFET structure as including two fins (e.g., fins 141a and 141b), this is merely an example. One skilled in the art will recognize there may be many modifications, alternatives and variations. For example, the semiconductor device of FIG. 8 may accommodate any number of fins depending on different applications and design needs.

FIGS. 9-12b illustrate various other embodiments consistent with the description illustrating additional FinFET arrangements, in accordance with some embodiments.

Figure 9:
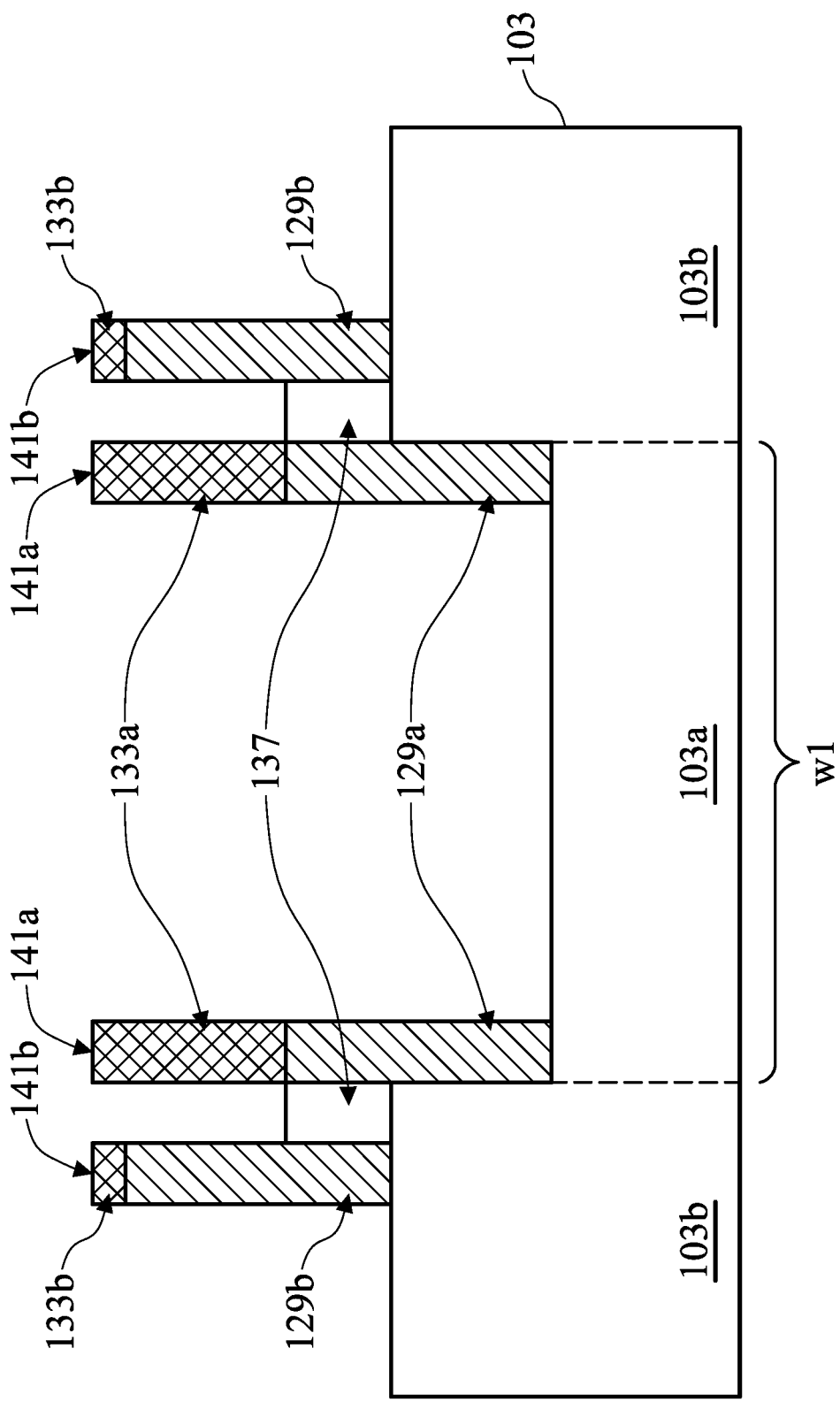
FIGS. 9-12*b* illustrate alternative arrangements of certain stages in the manufacturing of fins of a FinFET, in accordance with some embodiments.

FIG. 9 illustrates a double CMOS structure according to some embodiments. The structure of FIG. 9 can be created in the same way as previously described. The structure of FIG. 9 includes a multi-stepped substrate 103. The substrate 103 can be made from a bulk crystalline substrate or other suitable substrate, as described above. A photoresist can be disposed over the substrate above the 103b portions and the substrate etched to produce a recess over the 103a portion of the stepped substrate. The photoresist can be removed and a hard mask disposed over the stepped substrate. The hard mask can be formed over the substrate in a manner and of a material consist with that discussed above with respect to FIG. 3. A resist layer can be disposed over the hard mask layer and patterned to form openings corresponding to the fins 141a and 141b of FIG. 9.

The hard mask can be recessed down to the surfaces of the stepped substrate in a process consistent with that discussed above with respect to FIG. 4. A first epitaxy material 129a and 129b of FIG. 9 can be grown in each of the recesses in a process consistent with that discussed above with respect to FIG. 5. The epitaxy material 129a can have a higher lattice constant than the epitaxy material 129b. A semiconductor-based epitaxy 133a and 133b can respectively be grown over 129a and 129b in a process consistent with that described above with respect to FIG. 6. The semiconductor-based epitaxy 133a and 133b can overgrow the hard mask, forming a faceted structure above the hard mask. The structure can be planarized to remove the overgrowth and align a top surface of 133a and a top surface of 133b.

Figure 10:
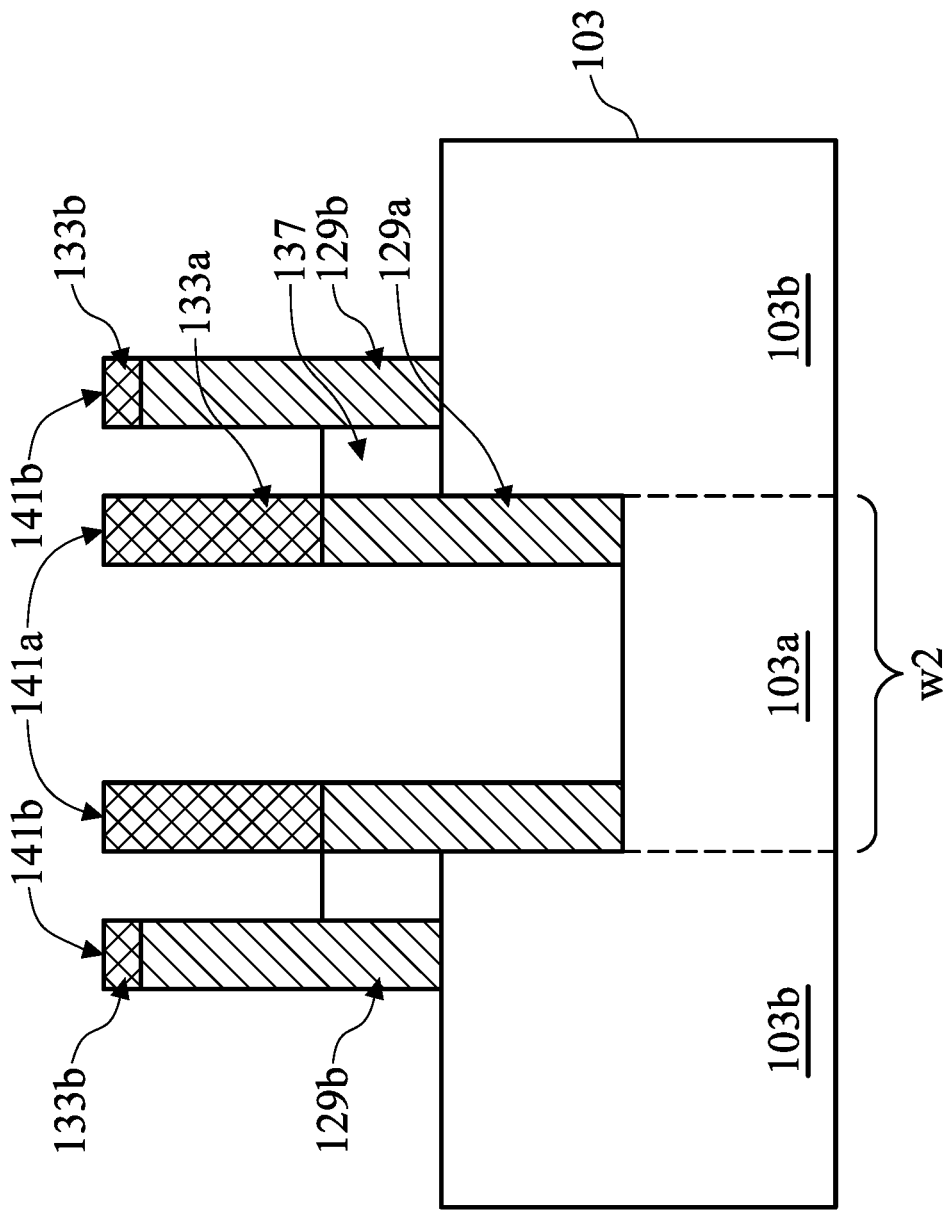

The hard mask can then be removed. A high density hard mask 137 can remain behind between the fins 141a and 141b, such as described above with respect to FIG. 8. The region defined by 103a of FIG. 9 has a width w1. The width w1 can be wider or narrower than the perspective depicted. For example, FIG. 10 illustrates an alternative embodiment with a width w2 which is much smaller than w1. Otherwise, the structure depicted in FIG. 10 can be manufactured in a manner consistent with that of FIG. 9.

Figure 11:
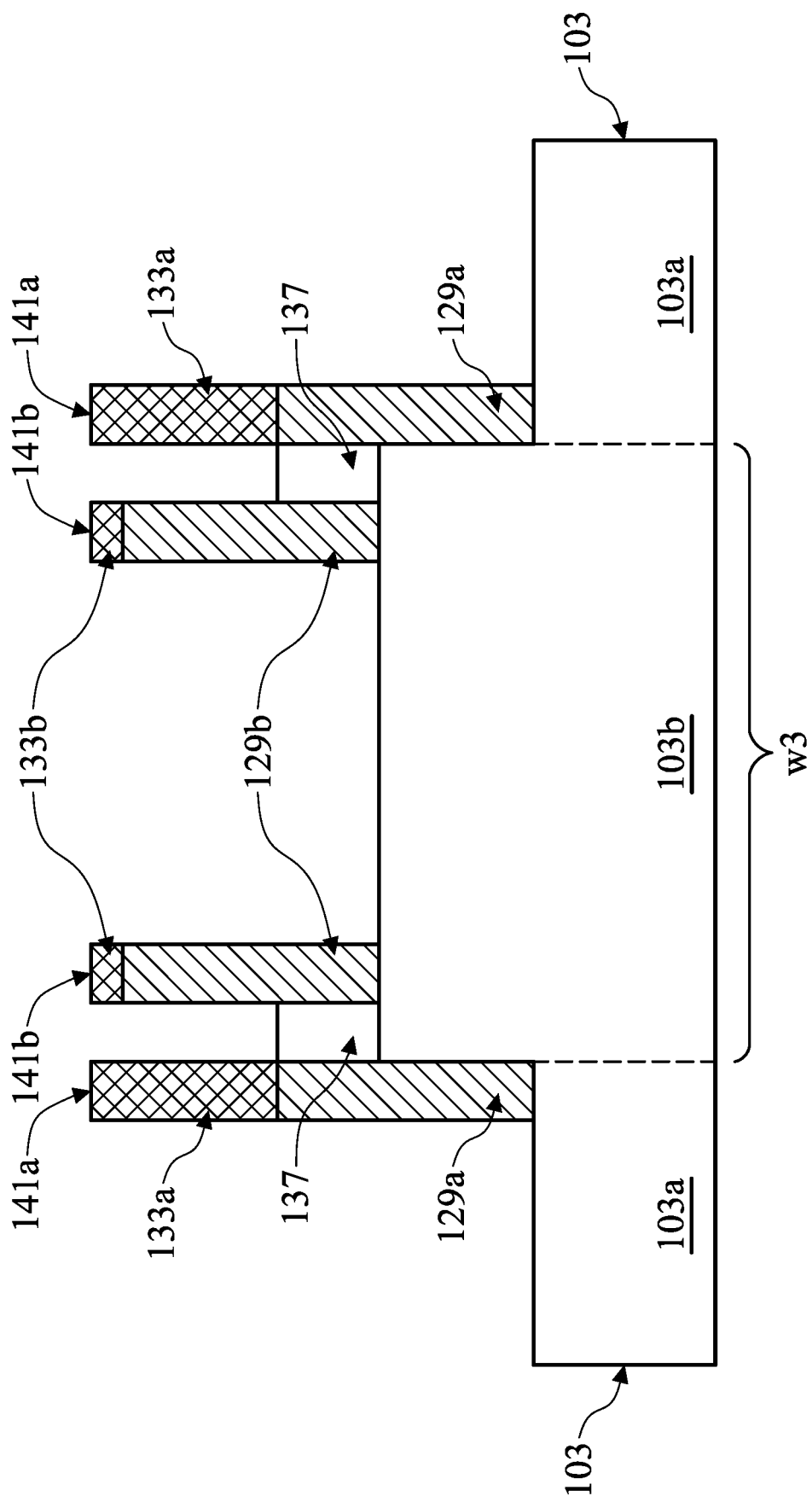

FIG. 11 illustrates a double CMOS structure according to some embodiments. The structure of FIG. 11 can be created in the same way as previously described above, for example, with respect to FIG. 9. The structure is similar to FIG. 9's structure except the etched substrate portion 103a appears on the outsides of the FinFET structure. The structure of FIG. 11 includes a multi-stepped substrate 103 and four FinFET fins manufactured in a way similar to that described above with respect to FIG. 9. The width in cross section of the substrate upper step 103b can be more or less than the perspective illustrated, similar to that described above with respect to the width of the lower step 103a in FIG. 10.

In some embodiments, embodiments consistent with the FIG. 9 and FIG. 11 can be combined to form additional step substrate combinations.

Figure 12A:
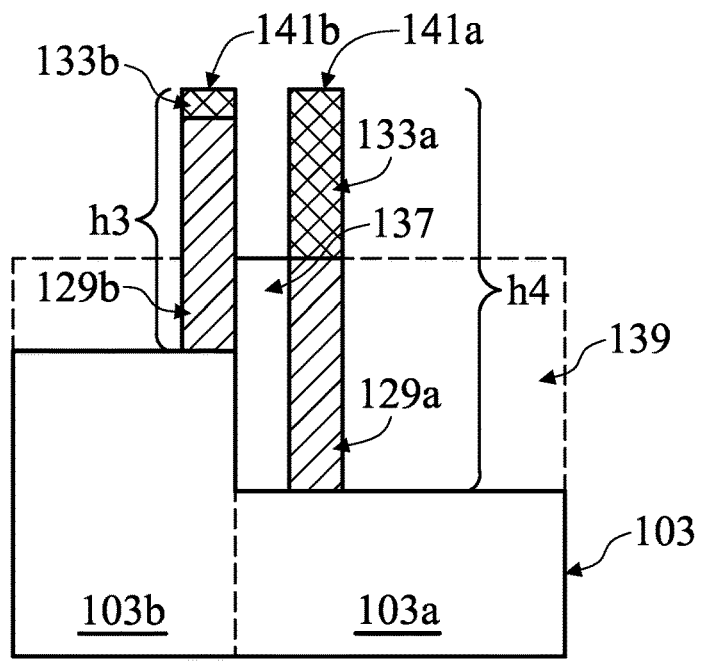
Figure 12B:
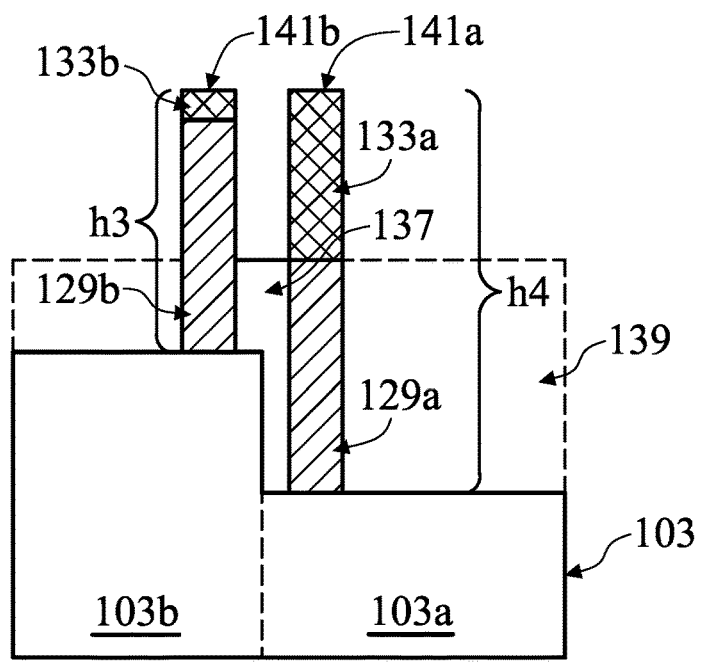

As discussed above with respect to FIGS. 4a-4c, the recesses 125a and 125b may be shifted. FIGS. 12a and 12b illustrate FinFET structures similar to the FinFET structure shown in FIG. 8 according to some embodiments in which the recesses 125a and 125b are shifted as illustrated in FIGS. 4b and 4c, respectively, wherein like numerals refer to like features. For example, the FinFET structure shown in FIG. 12a may result from the structure shown in FIG. 4b, after the processes described with respect to FIGS. 5-8 are performed, and the FinFET structure shown in FIG. 12b may result from the structure shown in FIG. 4c, after the processes described with respect to FIGS. 5-8 are performed.

Advantages of the present disclosure include providing a FinFET structure capable of having different strain values in each fin, while the fins can be made from the same materials and in the same process steps. Further, in some embodiments, the lattice constant in one fin can be different than the lattice constant of the same material in another fin. The FinFET can be used to provide an n-type fin channel to provide an NMOS and a p-type fin channel to provide a PMOS, which can be used to provide a CMOS FinFET device. The resulting fin structure can have different fin heights with different strain values and tensile strengths. The fin structure can be used to create a semiconductor device by adding a gate dielectric/insulator and gate material perpendicular to and over the fins. Source/drain regions can be added. In some embodiments the source or drain regions of the fins can be coupled together depending on application.

In accordance with some embodiments, a structure can include a stepped crystalline substrate that includes an upper step, a lower step, and a step rise. A first fin can include a crystalline structure having a first lattice constant. The first fin can be formed over the lower step. A second fin can include a crystalline structure having a second lattice constant, the second lattice constant being different than the first lattice constant. The second fin can be formed over the upper step apart from the first fin.

In accordance with some embodiments, a semiconductor structure can include a first fin and a second fin. The first fin can have a first height as measured from a substrate. The second fin can have a second height as measured from the substrate. The first height can be greater than the second height. Or, in other words, the first fin can be taller than the second fin. The uppermost surface of the first fin can be aligned with the uppermost surface of the second fin.

In accordance with some embodiments, a method includes etching a substrate to form a stepped substrate having an upper step and a lower step. A hard mask can be deposited over the stepped substrate. A first and second recess can be formed in the hard mask, with the first recess being over the lower step and the second recess being over the upper step. A first epitaxy material can be epitaxially grown in the first and second recess. The hard mask can be removed.

In accordance with some embodiments, a structure includes a first fin of a crystalline structure having a first lattice constant, the first fin formed over a lower step of a stepped substrate. The structure also includes a second fin of a crystalline structure having a second lattice constant, the second lattice constant being different than the first lattice constant, the second fin formed over an upper step of the stepped substrate, apart from the first fin.

In accordance with some embodiments, a semiconductor structure includes a first fin having a first height as measured from a first upper surface of a stepped substrate. The semiconductor structure also includes a second fin having a second height as measured from a second upper surface of the stepped substrate, where the first height is greater than the second height, and an uppermost surface of the first fin is aligned with an uppermost surface of the second fin.

In accordance with some embodiments, a device includes a first fin disposed on a lower surface of a stepped substrate, the first fin including a first epitaxial material and a second epitaxial material over the first epitaxial material, the first epitaxial material having a first thickness, the second epitaxial material having a second thickness. The device also includes a second fin disposed on an upper surface of a stepped substrate, the second fin adjacent the first fin, the second fin including a third epitaxial material, the third epitaxial material having a third thickness, the first epitaxial material being the same as the third epitaxial material, the first thickness being the same as the third thickness, where an upper surface of the first epitaxial material is offset an upper surface of the third epitaxial material.

In accordance with some embodiments, a structure includes a first fin formed over a lower step of a stepped substrate. The structure also includes a second fin formed over the upper step of the stepped substrate, a sidewall of the second fin aligned with a sidewall of a step rise to an upper step of the stepped substrate apart from the first fin.

In accordance with some embodiments, a semiconductor structure includes a first fin having a first height over a stepped substrate and a second fin having a second height greater than the first height over the stepped substrate, an uppermost surface of the first fin being aligned with an uppermost surface of the second fin. The semiconductor structure also includes a first insulating material disposed between the first fin and the second fin and a second insulating material disposed surrounding the first fin and the second fin, the first insulating material having a higher density than the second insulating material.

In accordance with some embodiments, a device includes a first fin disposed on a lower surface of a stepped substrate, the first fin including a first epitaxial material, the first epitaxial material having a first thickness. The device also includes a second fin disposed on an upper surface of a stepped substrate, the second fin including the first epitaxial material at the first thickness, an upper surface of the first epitaxial material of the first fin being offset an upper surface of the first epitaxial material of the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first fin formed over a lower step of a stepped substrate;
   a second fin formed over an upper step of the stepped substrate, a sidewall of the second fin aligned with a sidewall of a step rise from the lower step to the upper step of the stepped substrate apart from the first fin; and
   an isolation region disposed between the first fin and the second fin, the isolation region being under strain from the first fin and the second fin.

2. The structure of claim 1, wherein the second fin comprises a first epitaxial material, and wherein the first fin comprises the first epitaxial material and a second epitaxial material formed over the first epitaxial material.

3. The structure of claim 2, wherein a thickness of the first epitaxial material of the first fin is the same as a thickness of the first epitaxial material of the second fin.

4. The structure of claim 2, wherein the second fin comprises the second epitaxial material over the first epitaxial material, wherein a thickness of the second epitaxial material of the first fin is greater than a thickness of the second epitaxial material of the second fin.

5. The structure of claim 2, wherein an upper surface of the first epitaxial material of the first fin is higher than an upper surface of the upper step.

6. The structure of claim 1, wherein an upper surface of the first fin is level with an upper surface of the second fin.

7. The structure of claim 1, wherein the first fin comprises an n-type channel and the second fin comprises a p-type channel.

8. A semiconductor structure comprising:
   a first fin having a first height over an upper step of a stepped substrate, wherein the first fin and the stepped substrate comprise different materials;
   a second fin having a second height greater than the first height over a lower step of the stepped substrate, an uppermost surface of the first fin being aligned with an uppermost surface of the second fin; and a first insulating material disposed between the first fin, and the second fin and a second insulating material disposed surrounding the first fin and the second fin, the first insulating material having a higher density than the second insulating material, wherein the first insulating material is under compressive strain from the first fin and the second fin, wherein the first fin and the stepped substrate contact the first insulating material at an interface between the first fin and a top surface of the stepped substrate, and wherein a sidewall of a step rise of the stepped substrate is vertically aligned with a first sidewall of the first fin.

9. The semiconductor structure of claim 8, wherein the first fin comprises a first base portion extending from the stepped substrate, the first base portion comprising a first semiconductor material and a first upper portion disposed over the first base portion, the first upper portion comprising a second semiconductor material different from the first semiconductor material, wherein the second fin comprises a second base portion extending from the stepped substrate, the second base portion comprising the first semiconductor material.

10. The semiconductor structure of claim 9, wherein the first insulating material is disposed between the first base portion of the first fin and the second base portion of the second fin.

11. The semiconductor structure of claim 9, wherein the second fin further comprises a second upper portion disposed over the second base portion, the second upper portion comprising the second semiconductor material.

12. The semiconductor structure of claim 9, wherein the first base portion and the second base portion have thicknesses that are the same.

13. A device comprising:
a first fin disposed on a lower surface of a stepped substrate, the first fin comprising a first epitaxial material, the first epitaxial material having a first thickness; and a second fin disposed on an upper surface of the stepped substrate, the second fin comprising the first epitaxial material at the first thickness, an upper surface of the first epitaxial material of the first fin being offset from an upper surface of the first epitaxial material of the second fin.

14. The device of claim 13, further comprising:
an isolation region disposed between the first fin and the second fin, the isolation region comprising an insulating material compressed between an upper portion of the first fin and a lower portion of the second fin.

15. The device of claim 13, further comprising a third fin directly over the first fin, the third fin comprising a second epitaxial material different from the first epitaxial material.

16. The device of claim 15, wherein the third fin is vertically aligned with a portion of the second fin.

17. The device of claim 13, wherein a portion of the lower surface and a portion of the upper surface are each disposed between the first fin and the second fin.

18. The device of claim 13, further comprising:
a third fin disposed on the upper surface of the stepped substrate, the upper surface continuously extending between the second fin and the third fin; and
a fourth fin disposed on a second lower surface of the stepped substrate, the upper surface of the stepped substrate interposed between the first fin and the fourth fin.

19. The semiconductor structure of claim 8, wherein the first fin comprises an n-type channel and the second fin comprises a p-type channel.

20. The semiconductor structure of claim 11, wherein the second upper portion has a larger thickness than the first upper portion.

* * * * *